United States Patent [19]

Moore et al.

[11] Patent Number: 5,204,639

[45] Date of Patent: Apr. 20, 1993

[54] MILLER LOOP COMPENSATION NETWORK WITH CAPACITIVE DRIVE

[75] Inventors: Bradley T. Moore, Phoenix; Robert L. Vyne, Tempe; Renwin J. Yee, Mesa, all of Ariz.

[73] Assignee: Motorola, Inc., Schaumburg, Ill.

[21] Appl. No.: 873,855

[22] Filed: Apr. 27, 1992

[51] Int. Cl.$^5$ ............................................. H03F 1/34
[52] U.S. Cl. ...................................... 330/294; 330/107
[58] Field of Search ................ 330/76, 107, 151, 260, 330/294

[56] References Cited

U.S. PATENT DOCUMENTS 2,857,462 10/1958 Lin ................................. 330/294 X

FOREIGN PATENT DOCUMENTS 42211 3/1982 Japan ................................. 330/294

Primary Examiner—James B. Mullins
Attorney, Agent, or Firm—Joe E. Barbee

[57] ABSTRACT

A monolithic operational amplifier (10) having an Miller loop compensation network (13) with improved capacitive drive. The monolithic operational amplifier (10) has an input stage (11), an output stage (12), and a compensation network (13). The compensation network (13) provides negative feedback between an output node (19) of the output stage (12) and an input node (16) of the output stage (12). The compensation network (13) has a compensation capacitor (26), a resistor (27), an isolation resistor (33), a shunt capacitor (28), and an isolation transistor (25). The compensation network (13) creates a dominant pole, a zero and a nondominant pole having a higher frequency than the zero. The nondominant pole improves a gain margin while preserving sufficient phase margin. The isolation transistor (25) provides improved capacitive drive.

17 Claims, 1 Drawing Sheet

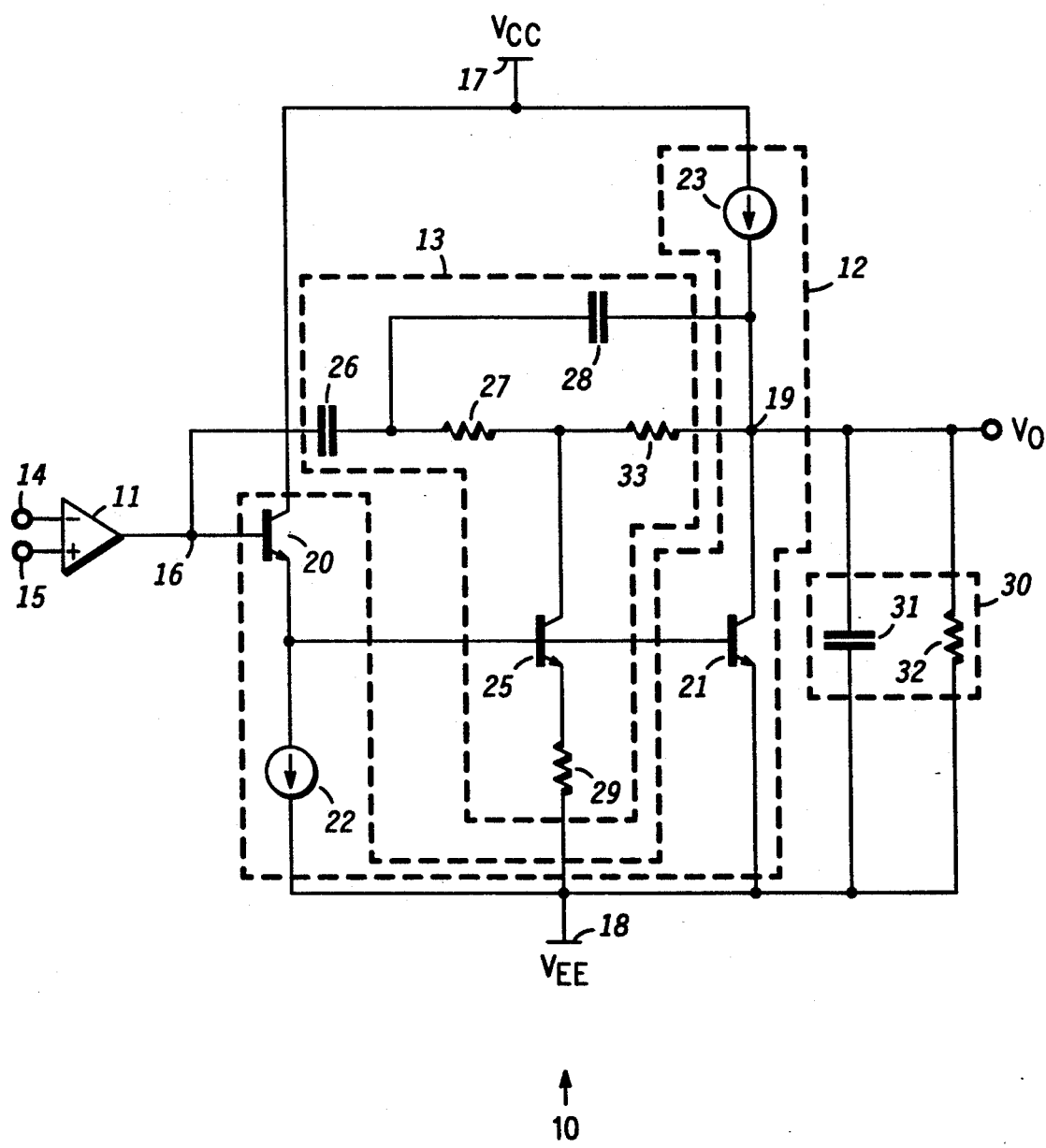

MILLER LOOP COMPENSATION NETWORK WITH CAPACITIVE DRIVE

BACKGROUND OF THE INVENTION

This invention relates, in general, to monolithic operational amplifiers, and more particularly, to monolithic operational amplifiers capable of driving capacitive loads while maintaining sufficient phase and gain margins.

In general, operational amplifiers include on chip compensation schemes to improve their stability. It is well known in the art that an operational amplifier configured for closed loop operation will be stable if an excess phase shift of an open loop gain is greater than $-180°$ at a gain of unity. Further, two well known figures of merit describing amplifier stability are a phase margin and a gain margin in the open loop configuration. The phase margin is defined as a difference between the excess phase shift, at unity gain, and $-180°$. The gain margin is defined as a difference between the value of the open loop gain, at a frequency at which the excess phase shift is $-180°$, and an open loop gain of unity.

An important method for improving operational amplifier stability is Miller compensation wherein a Miller compensation capacitor is placed in a feedback path of the operational amplifier. The compensation capacitor moves an input pole to a lower frequency creating a dominant pole and moves any output poles to higher frequencies; a technique commonly known as pole-splitting. The dominant pole ensures the open loop gain reaches unity before the excess phase shift becomes $-180°$.

In addition, Miller compensation may introduce a right half plane zero. In applications requiring low power consumption, the right half plane zero may become dominant and degrade the phase and gain margins of the operational amplifier. A resistor placed in series with the Miller compensation capacitor may move the right half plane zero such that it becomes a left half plane zero. A frequency at which the left half plane zero occurs is a function of a value of the resistor, a transconductance of an output stage transistor, and the Miller compensation capacitor. The resistor improves the phase margin and the stability of the operational amplifier. However, the zero created by the series combination of the resistor and the compensation capacitor may decrease the gain margin at higher frequencies, thus the stability of the operational amplifier may be decreased. Moreover, operational amplifiers having a compensation capacitor or a series combination of the resistor and the compensation capacitor may be unable to drive large capacitive loads. Accordingly, it would be advantageous to have a compensation scheme capable of driving a range of capacitive loads while maintaining sufficient phase and gain margins.

SUMMARY OF THE INVENTION

Briefly stated, the present invention is a monolithic operational amplifier with improved phase and gain margins capable of driving a range of capacitive loads. The operational amplifier has an input stage coupled to an output stage. A compensation network provides negative feedback between an output node of an output stage and an input node of the output stage. The compensation network includes a compensation capacitor, a first resistor, and an isolation resistor. A first terminal of the compensation capacitor is coupled to the input node of the output stage, and a second terminal of the compensation capacitor is coupled to a first terminal of the first resistor. A second terminal of the first resistor is coupled to a first terminal of the isolation resistor and a second terminal of the isolation resistor is coupled to the output node. A shunt capacitor is coupled in parallel across the first resistor-isolation resistor combination. A collector electrode of an isolation transistor is coupled to the first terminal of the isolation resistor. An emitter electrode of the isolation transistor is coupled to a second power supply terminal by a bias resistor. A base electrode of the isolation transistor is coupled to the input node.

BRIEF DESCRIPTION OF THE DRAWINGS

The single FIGURE illustrates a schematic diagram of an embodiment of the present invention integrated into an operational amplifier.

DETAILED DESCRIPTION OF THE DRAWINGS

The single FIGURE illustrates a schematic diagram of an embodiment of the present invention integrated into an operational amplifier 10. Operational amplifier 10, commonly referred to as op amp 10, has an input stage 11, an output stage 12, and a compensation network 13. Input stage 11 has a pair of differential input terminals, 14 and 15, and a single ended output terminal. Differential input terminals 14 and 15 are commonly referred to as inverting and noninverting input terminals, respectively. The single ended output terminal is coupled to an input node 16 of output stage 12.

Output stage 12 has an emitter-follower transistor 20 and an output transistor 21. Preferably, transistors 20 and 21 are bipolar transistors each having a base electrode, a collector electrode, and an emitter electrode, wherein the base electrode serves as a control electrode, and the emitter and collector electrodes serve as current carrying electrodes. The base electrode of emitter-follower transistor 20 serves as the input node 16 for output stage 12 and is connected to the single ended output terminal of input stage 11. Input node 16 serves as a single ended input node for output stage 12. The collector electrode of emitter-follower transistor 20 is connected to a first power supply terminal 17, commonly referred to as $V_{CC}$. Preferably, $V_{CC}$ is at a potential of 15 volts.

An emitter-follower bias current source 22 is connected to the emitter electrode of emitter-follower transistor 20. In addition, the emitter electrode of emitter-follower transistor 20 is connected to the base electrode of output transistor 21. The emitter electrode of output transistor 21 is connected to a second power supply terminal 18, commonly referred to as $V_{EE}$. Preferably, $V_{EE}$ is at a ground potential. The collector electrode of output transistor 21 is coupled to power supply terminal 17 by an output bias current source 23. The collector electrode of output transistor 21 serves as an output node 19 for op amp 10, commonly referred to as $V_O$. Output transistor 21 is configured as a common-emitter transistor.

It shall be understood that the number of op amp stages, the types of transistors, and the configuration of the stages is not a limitation of the present invention. In other words, op amp 10 may have more than two stages and the output stage may be in a configuration other than the emitter-follower-common-emitter configuration described. Many configurations for op amp input and output stages are well known to those skilled in the art.

In a preferred embodiment, compensation network 13 includes an isolation transistor 25, a compensation capacitor 26, a resistor 27, a shunt or by-pass capacitor 28, a bias resistor 29, and an isolation resistor 33. Isolation transistor 25 is also referred to as a capacitive drive transistor 25. Preferably, compensation capacitor 26 has a value of approximately 75 picofarads, resistor 27 has a value of approximately zero ohms shunt capacitor 28 has a value of approximately 10 picofarads, bias resistor 29 has a value of approximately 1,000 ohms, isolation resistor 33 has a value of approximately 10,000 ohms, emitter-follower bias current source 22 sources a current of approximately 20 microamps, and output bias current source 23 sources a current of approximately 220 microamps. However, if isolation transistor 25 is not used, isolation resistor 33 may have a value of approximately 2,000 ohms.

Preferably, isolation transistor 25 is a bipolar transistor having an emitter electrode, a collector electrode, and a base electrode, wherein the emitter and collector electrodes serve as current carrying electrodes, and the base electrode serves as a control electrode. The base electrode of isolation transistor 25 is connected to the emitter electrode of emitter-follower transistor 20. The emitter electrode of emitter-follower transistor 20, the base electrode of isolation transistor 25, and the base electrode of output transistor 21 share a common node. The emitter electrode of isolation transistor 25 is coupled to second power supply terminal 18 by bias resistor 29.

Preferably, an emitter current of output transistor 21 is greater than an emitter current of isolation transistor 25. One method for ensuring the emitter current of output transistor 21 is greater than that of isolation transistor 25 is to make the emitter area of output transistor 21 larger than that of isolation transistor 25. A second method is to select bias resistor 29 such that the emitter current in output transistor 21 is greater than the emitter current of isolation transistor 25. It is preferred that bias resistor 29 have a value of at least 1000 ohms.

Compensation capacitor 26 has a first terminal connected to input node 16 and a second terminal connected to a first terminal of resistor 27. Resistor 27 has a second terminal connected to the collector electrode of isolation transistor 25. Isolation resistor 33 has a first terminal connected to the second terminal of resistor 27. A second terminal of isolation resistor 33 is connected to output node 19. A first terminal of shunt capacitor 28 is connected to the the first terminal of resistor 27. A second terminal of shunt capacitor 28 is connected to the second terminal of isolation resistor 33. Thus, shunt capacitor 28 is connected in parallel across resistor 27 and isolation resistor 33, and serves as a bypass capacitor at high frequencies. The collector electrode of isolation transistor 25, the second terminal of resistor 27, and the first terminal of isolation resistor 33 share a common node. Output node 19 is common to output bias current source 23, the second terminal of shunt capacitor 28, the second terminal of isolation resistor 33, the collector electrode of output transistor 21, and a load network 30.

Load network 30 is connected to output node 19. Load network 30, illustrated in the single figure as a lumped resistor-capacitor network, comprises a load capacitor 31 and a load resistor 32 connected in a parallel configuration. It shall be understood that the type of load coupled to output node 19 is not a limitation of the present invention. It is well known to those skilled in the art that a lumped resistor-capacitor network is typically employed to represent an operational amplifier load.

In operation, differential input terminals 14 and 15 of input stage 11 receive a differential input signal from an external source (not shown). Input stage 11 is a gain stage which converts the differential input signal into a single ended signal. Because the single ended output terminal of input stage 11 is connected to input node 16, the single ended signal appears at input node 16. Input stage 11 may be represented as a voltage controlled current source wherein the differential input signal serves as a control voltage. The voltage controlled current source sources a current whose value is essentially a product of the control voltage and a transconductance of the input stage. The transconductance of the input stage is commonly referred to as $g_{mi}$.

Output stage 12 introduces a plurality of poles which may destabilize op amp 10 in a closed loop configuration. Frequency compensation network 13 couples output node 19 with input node 16 in a negative feedback configuration and serves to stabilize op amp 10. Output stage 12 provides additional gain to the single ended signal appearing at input node 16, whereas compensation network 13 provides stability.

Typically, an output response of op amp 10 is represented as a Bode plot wherein a magnitude of the gain and a phase angle are plotted as a function of frequency. It is well known that a left half plane pole decreases the gain magnitude at a rate of 20 decibels per decade of frequency and a left half plane zero increases the gain magnitude by 20 decibels per decade of frequency. Further, a left half plane pole shifts the phase angle by $-90°$, whereas the left half plane zero shifts the phase angle by $+90°$. A right half plane pole destabilizes an op amp, whereas a right half plane zero increases the gain magnitude by 20 decibels per decade of frequency and shifts the phase angle by $-90°$.

In the preferred embodiment, compensation capacitor 26 splits the plurality of output poles of output stage 12 such that a value of compensation capacitor 26 is Miller multiplied by a voltage gain of output stage 12, and adds to any capacitance at input node 16. Therefore a dominant pole is created at input node 16. A remainder of the plurality of output poles is moved to higher frequencies. In addition, when isolation resistor 33 is less than a value of approximately $1/g_{mo}$ of output transistor 21, compensation capacitor 26 may add a right half plane zero; wherein $g_{mo}$ is a transconductance of output transistor 21. The right half plane zero may degrade both the phase and the gain margins.

An increase in isolation resistor 33 greater than approximately $1/g_{mo}$ moves the right half plane zero to a lower frequency in a left half of the complex frequency plane, thereby creating a left half plane zero and improving the phase margin. However, when isolation resistor 33 becomes approximately a factor of ten, or more, greater than approximately $1/g_{mo}$ the gain magnitude portion of the output response may be limited to a minimum value given approximately by a product of a value of isolation resistor 33 and a value of $g_{mi}$. The gain magnitude portion remains approximately at the value given by the product of the value of isolation resistor 33 and the value of $g_{mi}$ thereby degrading the gain margin.

Shunt capacitor 28 and isolation resistor 33 create a nondominant pole at a frequency given approximately by a reciprocal of a product of isolation resistor 33 and shunt capacitor 28, thereby decreasing the gain magnitude response to a value below unity gain. The nondominant pole has a higher frequency than the left half plane zero. Shunt capacitor 28 may serve as an output attenuation means whereas isolation resistor 33 may serve as a zero modulation means. Thus the gain margin is improved while preserving sufficient phase margin. The frequency of the nondominant pole is commonly expressed as a reciprocal of a product of the values of isolation resistor 33 and shunt capacitor 28. The unity gain frequency is modulated by a value given by a ratio of the nondominant pole to the zero frequencies. In other words, the modulated unity gain frequency is given by a unity gain frequency of an operational amplifier with classical Miller compensation multiplied by the ratio of the nondominant pole to the zero frequencies.

Compensation network 13 includes a Miller compensation portion comprising isolation transistor 25 and compensation capacitor 26. The Miller compensation portion may serve as a pole splitting means and may include an output drive portion. A pole splitting action of classical Miller compensation portion may be suppressed by a large capacitive load coupled to output node 19. The Miller compensation portion is isolated from output node 19 by isolation resistor 33. Thus, capacitive loads coupled to output node 19 are isolated from the Miller compensation portion. Isolation of the the Miller compensation portion from output node 19 enables the Miller compensation portion to provide sufficient pole splitting when a large capacitive load is coupled to output node 19. The pole splitting action enables operational amplifier 10 to drive larger capacitive loads. Further, isolation transistor 25 provides an additional capacitive load drive capability. Preferably the operational amplifier has a gain margin of at least 5 decibels and a phase margin of at least 30°. For example, the gain margin for a capacitive load of 0.01 microfarads is approximately 20 decibels and the phase margin is approximately 58°.

By now it should be appreciated that there has been provided an operational amplifier having improved stability characteristics. Gain margin and phase margin, two figures of merit for an operational amplifier, are increased. A shunt capacitor is included in the compensation network and effectively shorts the resistor at high frequencies. Shorting the resistor creates an additional pole having a frequency higher than that of the zero, thereby improving gain margin while maintaining sufficient phase margin.

The Miller compensation portion of the compensation network is isolated from the output node by the isolation resistor, thereby protecting a Miller loop from capacitive loads coupled to the output node. Thus, capacitive loads coupled to the output node do not substantially interfere with the pole splitting action of the compensation networks' Miller compensation portion. The operational amplifier is capable of driving a range of capacitive loads while maintaining adequate phase and gain margins.

We claim:

1. A Miller loop compensation network with capacitive drive in an operational amplifier, comprising:
    an emitter-follower transistor having a collector electrode, an emitter electrode, and a base electrode, wherein the base electrode serves as an input node for the output stage, the collector electrode is coupled to a first power supply terminal and the emitter electrode is coupled to an emitter-follower bias current source;
    an isolation transistor having a base electrode coupled to the emitter electrode of the emitter-follower transistor and an emitter electrode coupled to a second power supply terminal by a bias resistor;
    a common-emitter output transistor having a base electrode coupled to the base electrode of the isolation transistor and a collector electrode coupled to an output bias current source, wherein the collector electrode serves as an output node;
    a compensation capacitor having a first terminal and a second terminal, wherein the first terminal is coupled to the input node and the second terminal is coupled to a first terminal of a first resistor and a second terminal of the first resistor is coupled to a collector electrode of the isolation transistor;
    an isolation resistor having a first terminal and a second terminal wherein the first terminal is coupled to the collector electrode of the isolation transistor and the second terminal is coupled to the collector electrode of the common-emitter output transistor; and
    a shunt capacitor having a first terminal coupled to the first terminal of the first resistor and a second terminal coupled to the second terminal of the isolation resistor.

2. The Miller loop compensation network with capacitive drive of claim 1 wherein the bias resistor is at least 1000 ohms.

3. The Miller loop compensation network with capacitive drive of claim 1 wherein a bias current in the common-emitter output transistor is larger than a bias current in the isolation transistor.

4. The Miller loop compensation network with capacitive drive of claim 1 wherein an emitter area of the common-emitter output transistor is larger than an emitter area of the isolation transistor.

5. The Miller loop compensation network with capacitive drive of claim 1 wherein the compensation capacitor is approximately 75 picofarads, the isolation resistor is approximately 10,000 ohms, and the shunt capacitor is approximately 10 picofarads.

6. A monolithic operational amplifier capable of driving a range of capacitive loads, comprising:
    a monolithic operational amplifier having an input stage comprising a pair of differential input terminals and a single ended output terminal;
    an output stage having a single ended input node coupled to the single ended output terminal of the input stage;
    a compensation capacitor having a first terminal and a second terminal, the first terminal coupled to the single ended input node of the output stage;
    a first resistor having a first terminal and a second terminal, the first terminal coupled to the second terminal of the compensation capacitor;
    a second resistor having a first terminal coupled to the second terminal of the first resistor and a second terminal coupled to an output node of the single ended output stage; and
    a shunt capacitor having a first terminal coupled to the first terminal of the first resistor and a second terminal coupled to the second terminal of the second resistor.

7. The monolithic operational amplifier of claim 6 further including an isolation transistor having a control electrode, a first current carrying electrode, and a second current carrying electrode wherein the second current carrying electrode is coupled to the second terminal of the first resistor, the first current carrying electrode is coupled to a second power supply terminal through a bias resistor and the control electrode is coupled to the single ended input node.

8. The monolithic operational amplifier of claim 7 wherein the output stage comprises an output transistor having a control electrode, a first current carrying electrode, and a second current carrying electrode, wherein the control electrode of the isolation transistor is coupled to the control electrode of the output transistor, the second current carrying electrode serves as the output of the operational amplifier, and the first current carrying electrode is coupled to the second power supply terminal.

9. The monolithic operational amplifier of claim 8 wherein a current in the first current carrying electrode of the output transistor is larger than a current in the first current carrying electrode of the isolation transistor.

10. The monolithic operational amplifier of claim 9 wherein the output transistor is a bipolar transistor having an emitter area larger than an emitter area of the isolation transistor, the isolation transistor being a bipolar transistor.

11. The monolithic operational amplifier of claim 9 wherein the bias resistor is at least 1000 ohms, the compensation capacitor is approximately 75 picofarads, the shunt capacitor is approximately 10 picofarads, and the second resistor is approximately 10,000 ohms.

12. An operational amplifier frequency compensation network, comprising:
 a pole splitting means, the pole splitting means comprising an isolation transistor and a compensation capacitor, wherein the pole splitting means includes an output capacitive drive and creates a dominant pole and at least one zero;
 a zero modulation means capable of moving the at least one zero in a complex frequency plane; and
 an output attenuation means wherein the output attenuation means cooperates with the zero modulation means to create a nondominant pole.

13. The operational amplifier frequency compensation network of claim 12 wherein the nondominant pole is at a higher frequency than the at least one zero, the nondominant pole increasing a gain margin while preserving a sufficient phase margin.

14. The operational amplifier frequency compensation network of claim 12 wherein a frequency at which a unity gain of an output response occurs is modulated by a ratio of a nondominant pole frequency to a frequency of the at least one zero.

15. The operational amplifier frequency compensation network of claim 12 wherein the zero modulation means cooperates with the pole splitting means to create a left half plane zero.

16. A method for increasing a capacitive drive of an operation amplifier, wherein the operational amplifier has a phase margin of at least 30° and a gain margin of at least 5 decibels, comprising the steps of:
 providing an operational amplifier having an input stage and an output stage, wherein the output stage has an input node and an output node;
 coupling the input node to the output node with a compensation network wherein the compensation network comprises a capacitive drive bipolar transistor having an emitter electrode, a collector electrode, and a base electrode;
 coupling a first terminal of a compensation capacitor to the input node;
 coupling a first terminal of a first resistor to a second terminal of the compensation capacitor;
 coupling a first terminal of a shunt capacitor to the second terminal of the compensation capacitor;
 coupling a second terminal of the first resistor and a first terminal of an resistor to the collector electrode;
 coupling a second terminal of the shunt capacitor and a second terminal of the isolation resistor to the output node;
 coupling the base electrode to the input node; and
 coupling the emitter electrode to a second power supply terminal through a bias resistor.

17. A Miller loop compensation network with capacitive drive in an operational amplifier, comprising:
 an emitter-follower transistor having a collector electrode, an emitter electrode, and a base electrode, wherein the base electrode serves as an input node for the output stage, the collector electrode is coupled to a first power supply terminal and the emitter electrode is coupled to an emitter-follower bias current source;
 an isolation transistor having a base electrode coupled to the emitter electrode of the emitter-follower transistor and an emitter electrode coupled to a second power supply terminal by a bias resistor;
 a common-emitter output transistor having a base electrode coupled to the base electrode of the isolation transistor and a collector electrode coupled to an output bias current source, wherein the collector electrode serves as an output node;
 a compensation capacitor having a first terminal and a second terminal, wherein the first terminal is coupled to the input node and the second terminal is coupled to a collector electrode of the isolation transistor;
 an isolation resistor having a first terminal and a second terminal wherein the first terminal is coupled to the collector electrode of the isolation transistor and the second terminal is coupled to the collector electrode of the common-emitter output transistor; and
 a shunt capacitor having a first terminal coupled to the first terminal of the isolation resistor and a second terminal coupled to the second terminal of the isolation resistor.

* * * * *

UNITED STATES PATENT AND TRADEMARK OFFICE
CERTIFICATE OF CORRECTION

PATENT NO. : 5,204,639

DATED : April 20, 1993

INVENTOR(S) : BRADLEY T. MOORE ET AL.

It is certified that error appears in the above-identified patent and that said Letters Patent is hereby corrected as shown below:

Claim 16, column 8, line 20, after "an" please insert --isolation--.

Signed and Sealed this

Fifteenth Day of March, 1994

Attest:

BRUCE LEHMAN

*Attesting Officer*     *Commissioner of Patents and Trademarks*